United States Patent [19]
Palandech et al.

[11] Patent Number: 5,486,789
[45] Date of Patent: Jan. 23, 1996

[54] APPARATUS AND METHOD FOR PROVIDING A BASEBAND DIGITAL ERROR SIGNAL IN AN ADAPTIVE PREDISTORTER

[75] Inventors: Robert L. Palandech, Bartlett; Wayne H. Bradley, Bloomingdale; George F. Opas, Park Ridge; James E. Mitzlaff, Arlington Heights, all of Ill.

[73] Assignee: Motorola, Inc., Schaumburg, Ill.

[21] Appl. No.: 395,259

[22] Filed: Feb. 28, 1995

[51] Int. Cl.$^6$ ........................................... H03F 1/32
[52] U.S. Cl. .................. 330/149; 332/103; 375/297; 455/63
[58] Field of Search ............................ 330/149; 332/103, 332/159, 162; 375/296, 297; 455/63

[56] References Cited

U.S. PATENT DOCUMENTS 3,900,823  8/1975  Sokal et al. .
4,291,277  9/1981  Davis et al. ........................... 330/149
5,049,832  9/1991  Cavers .

OTHER PUBLICATIONS

A. A. M. Saleh and J. Salz, "Adaptive Linearization of Power Amplifiers in Digital Radio Systems", The Bell System Technical Journal, vol. 62, No. 4, Apr. 1983, pp. 1019–1033.

*Primary Examiner*—James B. Mullins
*Attorney, Agent, or Firm*—Anthony G. Sitko

[57] ABSTRACT

The present invention provides an apparatus (200) and method (500) for providing a baseband digital error signal in an adaptive predistorter. A carrier cancellation circuit (202) provides a difference (212) between a first signal (208) based on an amplifier output and second signal (210) based on a data input. A quadrature demodulator (204) provides a baseband analog error signal (214) based on the difference (212). An analog-to-digital converter (206) provides the baseband digital error signal (216) based on the baseband analog error signal (214).

10 Claims, 3 Drawing Sheets

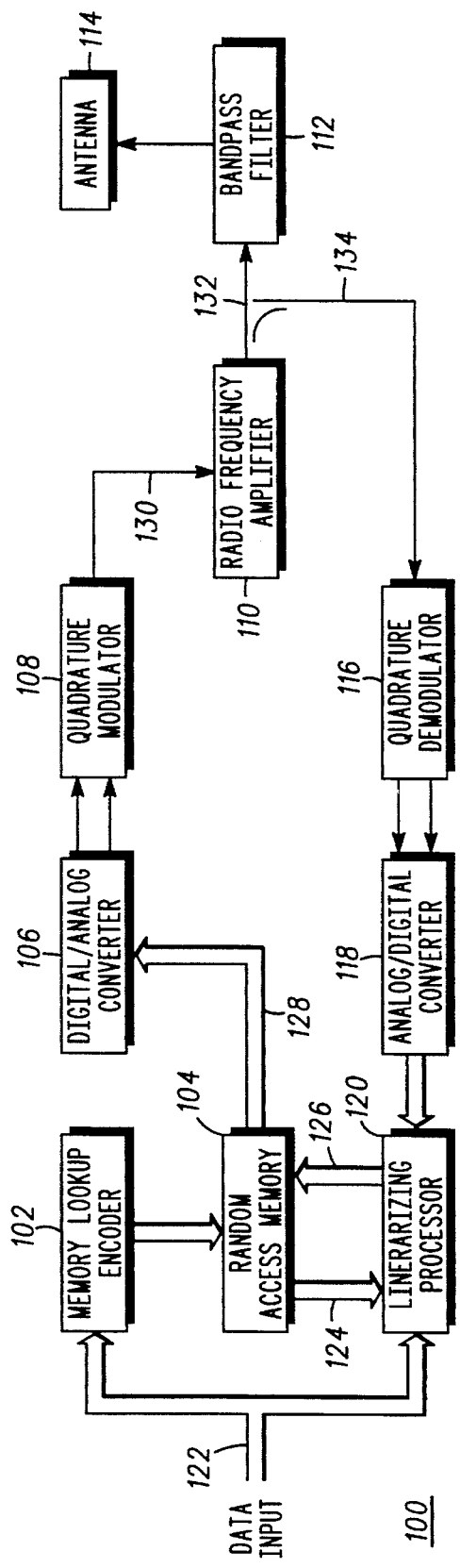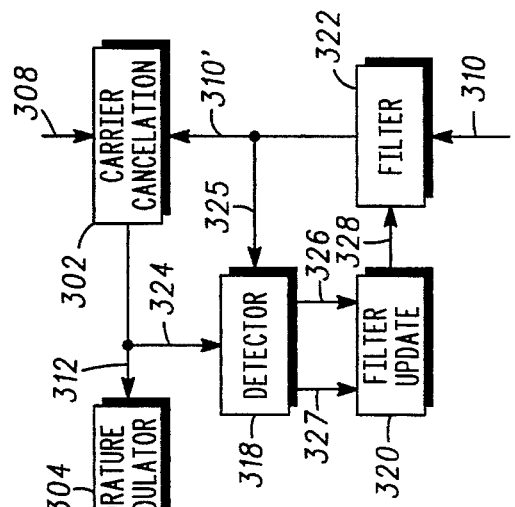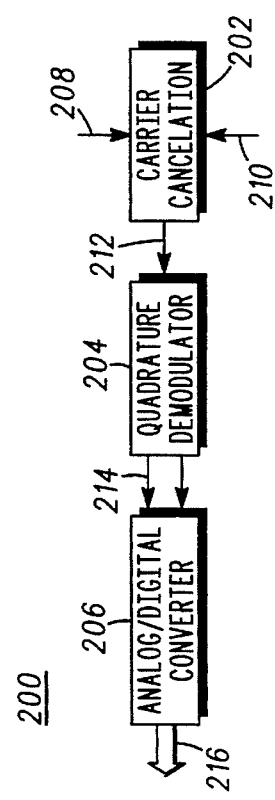
FIG. 1 — PRIOR ART — 100
FIG. 2 — 200
FIG. 3 — 300

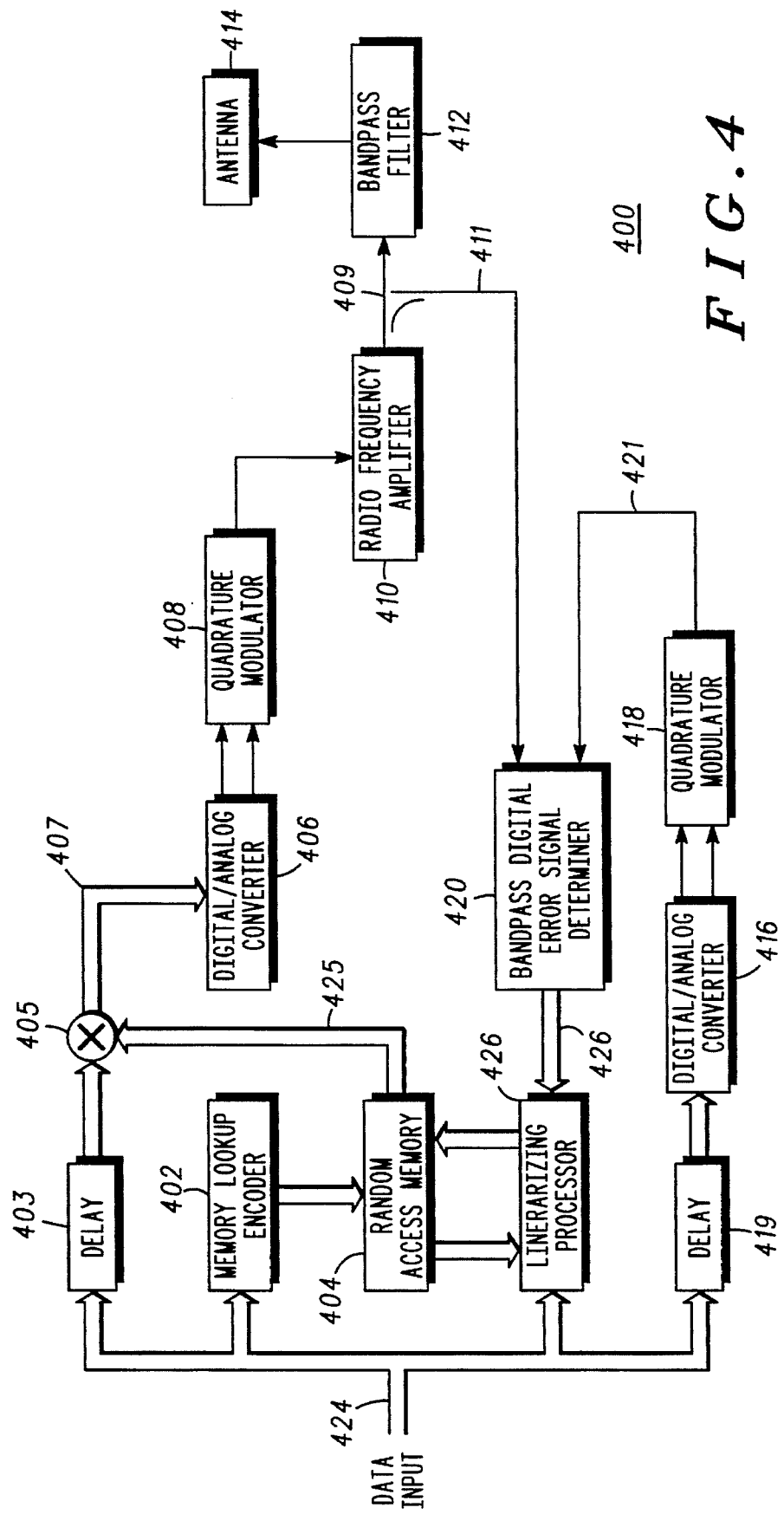

APPARATUS AND METHOD FOR PROVIDING A BASEBAND DIGITAL ERROR SIGNAL IN AN ADAPTIVE PREDISTORTER

FIELD OF THE INVENTION

The present invention relates generally to amplifier linearization, and more particularly to digital predistorters.

BACKGROUND OF THE INVENTION

Amplifiers introduce nonlinearities in a system due to clipping or crossover distortion. Typically, an amplifier will have an operating range over which an input will produce a linearly proportional output. For many applications, increased efficiency can be achieved if the input is allowed to span a range larger than the linear operating range. Clipping is a nonlinearity which occurs when an amplifier is driven by an input higher than the linear operating range and fails to produce a proportional increase in the output. Crossover distortion is a nonlinearity which occurs when an amplifier is driven by an input below the linear operating range of the amplifier. The nonlinearities may introduce intermodulation products which expand the frequency spectrum of the output outside of an allowable band.

Predistortion is a method of scaling an input in such a way that a subsequent nonlinear amplification results in an output that is linearly proportional to the input. For nonlinearities that do not vary with time, fixed predistortion methods have been used, but many amplifier applications introduce nonlinearities that vary with time due to temperature or operating capacity. For time varying nonlinearities, an adaptive predistortion technique must be applied. In adaptive predistortion, the input is scaled by one of a plurality of scaling factors based on a current condition of the amplifier. As the condition of amplifier changes, the scaling factors are recalculated based on minimizing the deviation of the amplifier output from linear operation. The deviation is an error signal. Typically, the error signal is a very small percentage of the amplifier output. A loss in resolution of the error signal leads directly to reduced benefit from the use of the linearizer. The preferred method of adapting the predistorter is using digital processing at baseband.

Accordingly, there is a need for a method and apparatus for providing a baseband digital error signal in an adaptive predistorter.

BRIEF DESCRIPTION OF THE DRAWINGS

FIG. 1 is a prior art block diagram of an adaptive predistorter.

FIG. 2 is a block diagram of a preferred embodiment of an apparatus for providing a baseband digital error signal in an adaptive predistorter in accordance with the present invention.

FIG. 3 is a block diagram of an alternate preferred embodiment of an apparatus for providing a baseband digital error signal in an adaptive predistorter in accordance with the present invention.

FIG. 4 is a block diagram of one embodiment of an adaptive predistorter which uses an apparatus for providing a baseband digital error signal in an adaptive predistorter in accordance with the present invention.

DETAILED DESCRIPTION OF THE PREFERRED EMBODIMENTS

Figure 5:
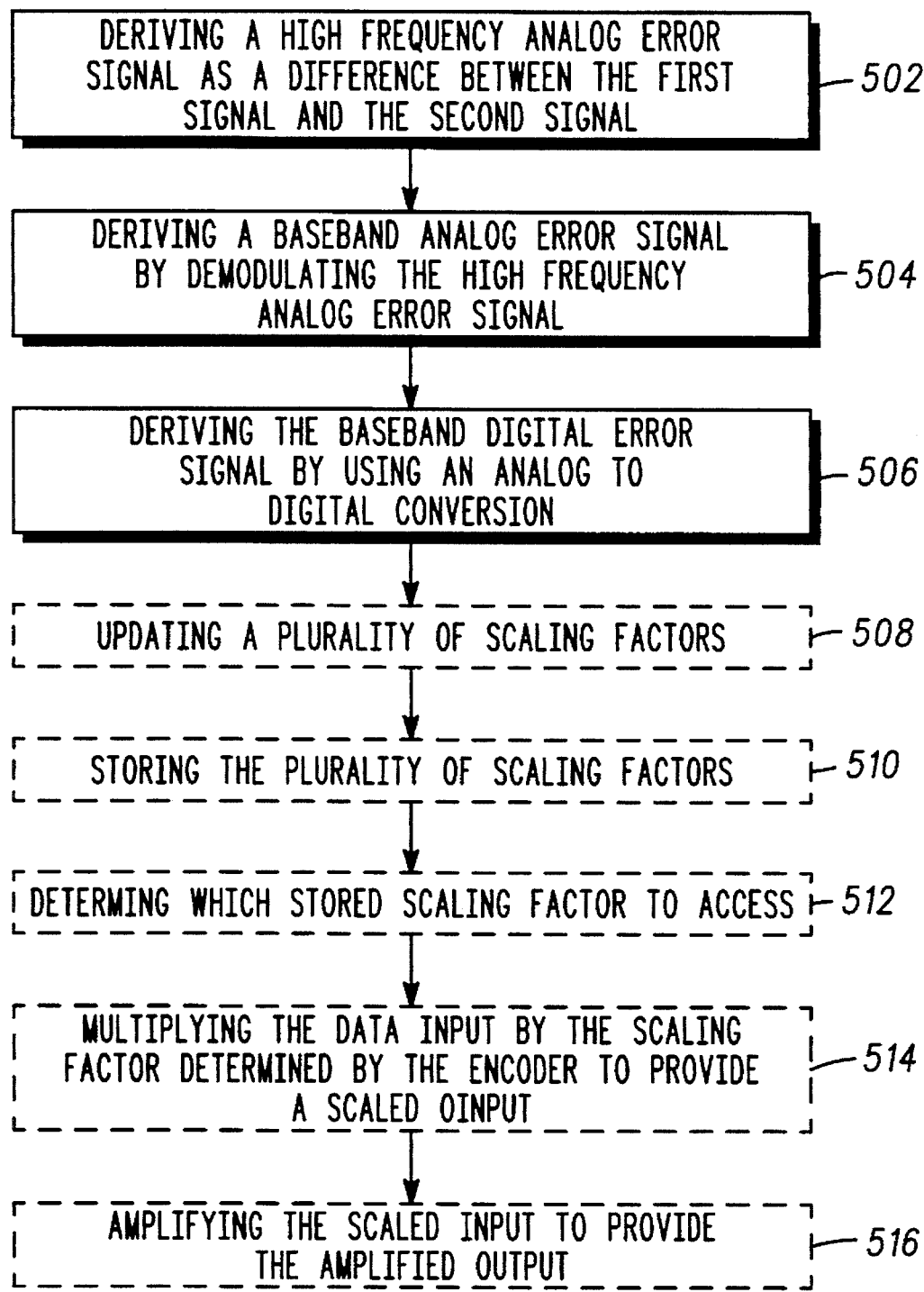
FIG. 5 is a flow diagram of one embodiment of steps of a method for providing a baseband digital error signal in an adaptive predistorter in accordance with the present invention.

Generally, the present invention provides an apparatus and method for creating a baseband digital error signal in an adaptive predistorter. Transmit amplifiers are designed to meet certain linearity requirements. Typically, intermodulation distortion, a ratio between the power of test sinusoidal signals and spectral products produced by amplifier nonlinearity, is 25 dB or greater for all allowed input power levels. Accordingly, if the linear part of an amplifier sample can be removed, the remaining nonlinear part is 25 dB lower in power than the whole sample. This concept can be used in the implementation of practical linearizers.

FIG. 1, numeral 100, is a prior art block diagram of an adaptive predistorter. The adaptive predistorter comprises a memory-lookup encoder (102), a random access memory (104), a digital/analog converter (106), a quadrature modulator (108), a radio frequency amplifier (110), a bandpass filter (112), an antenna (114), a quadrature demodulator (116), an analog/digital converter (118), and a linearizing processor (120).

A data input (122) is encoded by the memory-lookup encoder (102) in order to access a scaling factor (124) from the random access memory (104). The scaling factor (124) multiplies the data input (122) in the linearizing processor (120) to produce a scaled input (128). The scaled input (128) is converted from digital to analog by the digital/analog converter (106) and upconverted by the quadrature modulator (108). The upconverted signal (130) is amplified by the radio frequency amplifier (110) to provide an amplifier output (132). Scaling followed by amplifying provides the amplifier output (132) that is nearly linearly proportional to the data input (122) regardless of the linearity of the radio frequency amplifier (110). The amplifier output (132) is filtered by the bandpass filter (112) and transmitted by the antenna (114).

Since the amplifier's circuit characteristics are known to drift over time, the linearity of the radio frequency amplifier (110) may also vary over time. Consequently, a feedback path is required to permit updating of the random access memory (104). A sample (134) of the amplifier output (132) is demodulated by the quadrature demodulator (116) and converted to digital using the analog to digital converter (118) to provide a digital feedback signal (136). The sample (134) is equivalent to an attenuated amplifier output. The digital feedback signal (136) and the data input (122) are used by the linearizing processor (120) to determine the revised scaling factors in the random access memory (104).

The scaling factors stored in the random access memory (104) are updated in the linearizing processor based on the difference between the data input (122) and the digital feedback signal (132). The update equation is:

$$r_{n+1} = r_n - a_n * (R_n - G_n)$$

where $r_{n+1}$ is a new scaling factor, $r_n$ is a previous scaling factor, $a_n$ is a coefficient that tends to decrease as n increases, $R_n$ is the magnitude of the digital feedback signal (136), and $G_n$ is a scaled version of the data input (122).

FIG. 2, numeral 200, is a block diagram of a preferred embodiment of an apparatus for providing a baseband digital error signal in an adaptive predistorter in accordance with the present invention. The apparatus for providing the baseband digital error signal comprises a carrier cancellation circuit (202), a quadrature demodulator (204), and an analog-to-digital converter (206).

The carrier cancellation circuit (202) receives a first signal (208) based on an amplifier output and a second signal (210) based on a data input. The carrier cancellation circuit (202) derives a high frequency analog error signal (212) as a difference between the first signal (208) and the second signal (210). The second signal (210) is the data input upconverted from baseband to a radio frequency and delayed by an amount of time equal to the total delay through the loop. This includes elements analogous to those depicted in FIG. 1 such as the memory lookup encoder, the random access memory, the digital-to-analog converter, the quadrature modulator, the radio frequency amplifier, and the output coupler. The first signal (208) is the amplifier output attenuated by the output coupler. Typically, the nominal gain of the amplifier and the attenuation are measurable. If the attenuation is equal to the nominal gain, the first and second signals are amplitude aligned and the difference is provided by inverting one signal and combining it with the other signal using a radio frequency combiner. When the attenuation is not equal to the nominal gain, one signal must be amplitude aligned with the other signal by adding attenuation. When the phases of the first signal (208) and second signal (210) exhibit a constant offset in a differential measurement, one or both signals must be phase shifted to provide phase alignment.

The quadrature demodulator (204) is operably coupled to the carrier cancellation circuit for deriving a baseband analog error signal (214) by demodulating the high frequency analog error signal (212). The baseband analog error signal (214) is a vector having both an in-phase component and a quadrature-phase component. The quadrature demodulator (204) includes two radio frequency mixers for the down conversion of each component to baseband.

The analog-to-digital converter (206) is operably coupled to the quadrature demodulator (204) for deriving the baseband digital error signal (216). Since the baseband analog error signal (214) is a vector having an in-phase component and a quadrature-phase component, the analog-to-digital converter (206) typically consists of two analog to digital converters. In this apparatus the analog-to-digital converter (206) has a lower resolution requirement than the analog-to-digital converter (118) in FIG. 1 and still provides the same resolution for the digital error signal as provided by the linearizing processor (120). The first signal (208) and the second signal (210) are much larger signals than the derived difference (212). Since the difference (212) is derived in the analog domain, the analog-to-digital converter (206) will not be required to resolve the much larger signals. Typically, the ratio in power of the much larger signals (208 and 210) to the difference (212) is 25 dB. The 25 dB equates to 4 bits less resolution to be required of the analog-to-digital converter (206).

FIG. 3, numeral 300, is a block diagram of an alternate preferred embodiment of an apparatus for providing a baseband digital error signal in an adaptive predistorter in accordance with the present invention. The apparatus for providing the baseband digital error signal comprises a carrier cancellation circuit (302), a quadrature demodulator (304), an analog-to-digital converter (306), detector (318), a filter update element (320) and a filter (322).

Similar to the operation of the baseband digital error signal apparatus (200) described above, the carrier cancellation circuit (302) receives a first signal (308) based on an amplifier output and a second signal (310') based on a data input. The carrier cancellation circuit (302) derives a high frequency analog error signal (312) as a difference between the first signal (308) and the second signal (310'). The data signal (310) is passed through filter (322) to provide the second signal (310'). Signal (310) is similar to signal (210). That is, the signal (310) is the data input upconverted from baseband to a radio frequency and delayed by an amount of time equal to the total delay through the loop back to the carrier cancellation circuit (302) less the delay through the filter (322). This includes elements analogous to those depicted in FIG. 1 such as the memory lookup encoder, the random access memory, the digital-to-analog converter, the quadrature modulator, the radio frequency amplifier, and the output coupler. The first signal (308) is similar to first signal (208) described above.

In preferred embodiments of the present invention, filter (322) may be a passive device or an adaptable device depending on the stability characteristics of the power amplifier. Shown in FIG. 3 is one preferred embodiment wherein filter (322) is an adaptable device. It should be understood, however, that if a passive filter device is used, detector (318) and filter update element (320) are not required.

With continued reference to FIG. 3, filter (322) is adaptable and may be an electronically adjustable analog filter, an adjustable tap surface acoustic wave (SAW) device, a programmable digital device, or a combination of these devices. Filter (322) receives an update signal (328) from filter update element (320). Update signal (328) may consist of a plurality of digital words, analog values (voltage or current levels) or a combination of such signals as is required to control key parameters of filter (322). Typical controlled parameters may include overall gain and phase shift, linear and quadratic (polynomial) components of amplitude and phase variation versus frequency, values of variable circuit elements in an analog filter, or values of tap coefficients in a digital filter. It should be noted that, in many applications, simple gain and phase shift control will be sufficient to compensate for changes in PA characteristics.

The input to filter update element (320) is a pair of voltage signals, (326) and (327), received from detector (318). The voltage signal (326) corresponds to an average amplitude of the derived difference (312) output of the carrier cancellation circuit (302). The voltage signal (327) corresponds to an average amplitude of the second signal (310') input to the carrier cancellation circuit (302). In the preferred embodiment, detector (318) may be a pair of diode detectors, each followed by a low pass filter.

Filter update element (320) first digitizes both signals (326) and (327) then calculates the ratio of (327) to (326), which represents the amount of carrier suppression provided by the carrier cancellation circuit (302). If this carrier suppression ratio is greater than a predetermined value, say 25 dB, then there is no change to update signal (328), since it is assumed that complete carrier cancellation is already occurring in circuit (302). There is also no change to update signal (328) when signal (326) itself falls below a predetermined value which represents the smallest signal level that detector (318) can resolve accurately. In all other cases, filter update element (320) performs a sequence of small step changes to each filter parameter controlled by update signal (328) and retains the settings which produce the greatest carrier suppression ratio. In a typical sequence, the value of the first filter parameter is first raised, then lowered, by some small factor, while continuously monitoring the carrier suppression ratio. The first filter parameter is then set to the value which produced the greatest carrier suppression ratio. Note that this value could be the original value for this parameter. This entire process is then repeated for each of the remaining filter parameters controlled by update signal (328), and cycles back to the first parameter after updating the last parameter in update signal (328).

The effect of filtering the input signal prior to carrier cancellation is to produce a minimum output from carrier cancellation circuit (302). If carrier cancellation circuit (302) produces an imperfect output, i.e., a difference signal (312) containing linear error components resulting from a mismatch of gain/phase frequency response characteristics, this difference signal has an overwhelming effect on the adaptive predistorter. The purpose of filter (322) is to provide a gain/phase response versus frequency that very closely matches the gain/phase response of the path analogous to that depicted in FIG. 1 including elements such as the memory lookup encoder, the random access memory, the digital-to-analog converter, the quadrature modulator, the radio frequency amplifier, and the output coupler. Filtering signal (310) thus removes linear error components from the output of carrier cancellation circuit (302) allowing the adaptive predistorter to operate on only the non-linear error terms, as it is intended to do.

The operation of the remainder of the baseband digital error signal apparatus (300) is analogous to the operation of baseband digital error signal apparatus (200) described above, FIG. 4 is a block diagram of one embodiment of an adaptive predistorter which uses an apparatus for providing a baseband digital error signal in an adaptive predistorter in accordance with the present invention. The adaptive predistorter comprises a memory-lookup encoder (402), a delay (403), a random access memory (404), a multiplier (405), a first digital/analog converter (406), a quadrature modulator (408), a radio frequency amplifier (410), a bandpass filter (412), an antenna (414), a second digital/analog converter (416), a quadrature modulator (418), a delay (419), a baseband digital error signal determiner (420), and a memory updater (422).

The random access memory (404) stores a plurality of complex-valued scaling factors. The memory-lookup encoder (402) receives a data input (424) and determines which scaling factor to access from the random access memory (404). The multiplier (405) multiplies the data input (424) by the scaling factor (425) determined by the encoder to provide a scaled input (407). This predistorter exploits the fact that multiplication of a data point of non zero magnitude on the I-Q phase plane by a complex constant may yield a product at any point in the phase plane.

The scaled input (407) is converted to analog by the first digital to analog converter (406), modulated by the quadrature modulator (408), and amplified by the radio frequency amplifier (410) to provide the amplifier output (409). This output includes intermodulation products that effectively increase the bandwidth of the RF output. Nearly all of the amplifier output (409) is filtered by the bandpass filter (412) and transmitted by the antenna (414). The small portion of the amplifier output (409) that is not transmitted is a first signal (411) that is used for updating the scaling factors.

The data input (424) is converted to analog using the second analog/digital converter (416) and upconverted to RF using the quadrature modulator (418). The upconverted signal is delayed to provide a second signal (421). The total delay in the path between the data input (424) and the second signal (421) is equal to the delay through the memory-lookup encoder (402), random access memory (404), delay (403), mixer (405), digital to analog converter (406), quadrature modulator (408), radio frequency amplifier (410), and coupler (409). These two delays must be closely matched because deviations of even a small fraction of the modulation's characteristic symbol time are unacceptable.

The baseband digital error signal determiner (420) is either the apparatus for providing a baseband digital error signal (216) or (316) as described in reference to FIG. 2 or FIG. 3 respectively. The first signal (411) and the second signal (421) are used to provide the baseband digital error signal (426).

The memory updater (422) is operably coupled to the analog-to-digital converter (206 or 306), and to receive the data input, for updating a plurality of scaling factors. The memory updater (422) uses the baseband digital error signal (426) to calculate a magnitude scaling factor by the equation:

$$r_{n+1}=r_n-a_n*|E_n|$$

where $r_{n+1}$ is the new magnitude scaling factor, $r_n$ is the previous magnitude scaling factor, $a_n$ is a coefficient that tends to decrease as n increases and $|E_n|$ is the magnitude of the baseband digital error signal (426). A phase adjust factor is also derived from the digital error signal in a similar fashion. The combination of the magnitude scaling factor and the phase alignment factor provides a complex scaling factor.

FIG. 5, numeral 500, is a flow diagram of one embodiment of steps of a method for providing a baseband digital error signal in an adaptive predistorter in accordance with the present invention. The first step is deriving a high frequency analog error signal as a difference between the first signal and the second signal (502). The second step is deriving a baseband analog error signal by demodulating the high frequency analog error signal (504). The demodulating block must be designed to demodulate a bandwidth many times the modulation bandwidth in order to pass intermodulation distortion products that are to be reduced. The third step is deriving the baseband digital error signal by using an analog to digital conversion (506).

The method may be further expanded by five additional steps. The fourth step is updating a plurality of scaling factors (508). The fifth step is storing the plurality of scaling factors (510). The sixth step is determining which scaling factor is to be accessed from the storage unit (512). The determination must be made at a rate which is at least equal to the Nyquist sampling rate of the highest order amplifier intermodulation product which the linearizer is expected to operate on. The seventh step is multiplying the data input by the scaling factor determined by the encoder to provide a scaled input (514). The eighth step is amplifying the scaled input to provide the amplifier output (516).

Carrier cancellation allows the analog-to-digital converters to be lower in resolution while still provide the same resolution error signal. The delayed input and the high frequency analog radio frequency amplifier output are much larger signals than the derived difference between them. Since the difference between the delayed input and the high frequency analog radio frequency amplifier output is derived in the analog domain, analog-to-digital converters will not be required to resolve the much larger signals. Since the minimum detectable power input is an analog-to-digital converter characteristic, it follows that the smaller input signals require fewer bits in the conversion process to achieve the same accuracy. Typically, the ratio in power of the much larger signals to the difference is 25 dB. The 25 dB equates to 4 bits less resolution to be required of the analog-to-digital converters.

Although exemplary embodiments are described above, it will be obvious to those skilled in the art that many alterations and modifications may be made without departing from the invention. Accordingly, it is intended that all such alterations and modifications be included within the spirit and scope of the invention as defined in the appended claims.

We claim:

1. An apparatus for providing a baseband digital error signal for an adaptive predistorter, wherein the adaptive predistorter comprises a first signal based on an amplifier output and a second signal based on a data input, the apparatus comprising:

a) a carrier cancellation circuit, operably coupled to receive the first signal and the second signal, for deriving a high frequency analog error signal as a difference between the first signal and the second signal;

b) a quadrature demodulator, operably coupled to the carrier cancellation circuit, for deriving a baseband analog error signal by demodulating the high frequency analog error signal; and c) an analog-to-digital converter, operably coupled to the quadrature demodulator, for deriving the baseband digital error signal.

2. The apparatus of claim 1, wherein the apparatus further comprises:

d) a memory updater, operably coupled to the analog-to-digital converter and to receive the data input, for updating a plurality of scaling factors;

e) a random access memory, operably coupled to the memory updater, for storage of the scaling factors;

f) a memory-lookup encoder, operably coupled to receive the data input, for determining a scaling factor to be accessed from the random access memory;

g) a multiplier, operably coupled to the storage unit and data input, for multiplying the data input by the scaling factor determined by the encoder to provide a scaled input; and h) a radio frequency amplifier, operably coupled to the multiplier, for amplifying the scaled input to provide the amplifier output.

3. The apparatus of claim 1 wherein the carrier cancellation circuit further comprises a filter operably coupled to receive and filter the second signal to produce a filtered second signal.

4. The apparatus of claim 3 wherein the filter comprises one of an electronically adjustable analog filter, an adjustable tap surface acoustic wave (SAW) filter and a programmable digital device.

5. The apparatus of claim 4 further comprising a filter control element having an input coupled to receive at least one voltage signal and an output coupled to an input of the filter.

6. The apparatus of claim 5 wherein the at least one voltage signal comprises an average amplitude of the high frequency analog error signal.

7. The apparatus of claim 5 wherein the at least one voltage signal comprises an average amplitude of the filtered second signal.

8. A method for providing a baseband digital error signal for an adaptive predistorter, wherein the adaptive predistorter comprises a first signal based on an amplifier output and a second signal based on a data input, the method comprising:

a) deriving a high frequency analog error signal as a difference between the first signal and the second signal;

b) deriving a baseband analog error signal by demodulating the high frequency analog error signal; and c) deriving the baseband digital error signal by using an analog to digital conversion.

9. The method of claim 8, wherein the method further comprises:

d) updating a plurality of scaling factors;

e) storing the plurality of scaling factors;

f) determining a scaling factor of the plurality of scaling factors to access;

g) multiplying the data input by the scaling factor to provide a scaled input; and h) amplifying the scaled input to provide the amplifier output.

10. The method of claim 8 further comprising the step of filtering the second signal.

* * * * *